United States Patent
Zach

(10) Patent No.: US 6,858,844 B2
(45) Date of Patent: Feb. 22, 2005

(54) METHOD FOR DETECTING GEOMETRICAL-OPTICAL ABERRATIONS

(76) Inventor: Joachim Zach, Hermann-Löns-Strasse 24, Österingen (DE), 76684

( * ) Notice: Subject to any disclaimer, the term of this patent is extended or adjusted under 35 U.S.C. 154(b) by 0 days.

(21) Appl. No.: 10/181,706
(22) PCT Filed: Dec. 20, 2000
(86) PCT No.: PCT/DE00/04578
   § 371 (c)(1),
   (2), (4) Date: Jul. 22, 2002
(87) PCT Pub. No.: WO01/56057
   PCT Pub. Date: Aug. 2, 2001

(65) Prior Publication Data
   US 2003/0001102 A1 Jan. 2, 2003

(30) Foreign Application Priority Data
   Jan. 26, 2000 (DE) .......................................... 100 03 127

(51) Int. Cl.[7] .............................................. G01N 23/00
(52) U.S. Cl. ......................... 250/310; 250/306; 250/307
(58) Field of Search ........................ 250/288, 306–311, 250/396 R, 201.1, 201.2, 201.3; 382/280, 325

(56) References Cited

U.S. PATENT DOCUMENTS 5,654,547 A * 8/1997 Coene et al. ................ 250/307
5,753,913 A * 5/1998 Coene et al. ................ 250/307
6,067,164 A * 5/2000 Onoguchi et al. .......... 356/401
6,476,398 B1 11/2002 Xu et al. ................. 250/396 R

FOREIGN PATENT DOCUMENTS

DE   197 39 290 A   3/1999
GB   2 305 324 A    4/1997

OTHER PUBLICATIONS

Ogasawara et al., Japanese Journal of Applied Physics, vol. 38, No. 2A, pp. 957–960 )1999).
Zach et al., Nuclear Instruments and Methods in Physics Research, vol. A363, No. 1, pp. 316–325 (1995).

* cited by examiner

Primary Examiner—Nikita Wells
Assistant Examiner—Christopher M. Kalivoda
(74) Attorney, Agent, or Firm—Birch, Stewart , Kolasch & Birch, LLP

(57) ABSTRACT

The invention relates to a method for determining geometrical-optical aberrations up to and including 3rd order in particle-optical, probe-forming systems, in particular scanning electron microscopes, comprising an essentially punctiform source, lenses, an object, and a detector, the image being recorded, the process being repeated with an overfocussed and an underfocussed beam, the images being transformed in Fourier space, the transformation of the overfocussed image, and the underfocussed image is divided by the transformed focussed image. The results are reverse transformed, and the brightness profiles of the probes, the images of the source, are determined in overfocus and underfocus. The asymmetry, the width and/or the curvature of the profile being determined in the center, and the image aberration being determined from the differences.

13 Claims, 5 Drawing Sheets

METHOD FOR DETECTING GEOMETRICAL-OPTICAL ABERRATIONS

This application is the national phase under 35 U.S.C. §. 371 of PCT International Application No. PCT/DE00/04578 which has an International filing date of Dec. 20, 2000, which designated the United States of America.

BACKGROUND OF THE INVENTION

1. Field of the Invention

The present invention relates to a method for determining geometrical-optical aberrations up to and including 3rd order in particle-optical, probe-forming systems, in particular scanning electron microscopes comprising an essentially punctiform source, which emits the particles, lenses for influencing the particle beam, an object, which is imaged by the particles, and a detector for registering the particles or imaging the object, the object being imaged by a particle beam focussed on the object, and the image being recorded; the process being repeated with an overfocussed and an underfocussed beam, which produce the images (overfocussed) and (underfocussed), the images being transformed in Fourier space, the transformation of the overfocussed image being divided by that of the transformed focussed image, and the quotient being obtained, and the transformation of the underfocussed image being divided by that of the transformed focussed image and the quotient being obtained.

2. Description of the Background Art

Scanning electron microscopes operate according to the principle that a sharply focussed electron beam, whose diameter determines the efficiency and resolution, is guided line by line over an object surface to be analyzed. The electrons passing through the object or scattered back therefrom, or the secondary electrons released in the object surface, are either collected in a collector or amplified by means of a scintillator and a downstream photomultiplier and used for controlling the display. For emission of the electrons, a source under high voltage is used, which usually takes the form of a tungsten tip, whose diameter is of the order of a few nm. Via the tip, an essentially punctiform particle source can be provided with virtually any accuracy. The image of the source, that is to say the tungsten tip, of the microscope optics is usually described as the probe.

In the case of particle optical systems, in particular scanning electron microscopes, the resolution capacity and the quality of the image is limited, inter alia, by the geometrical-optical aberrations, which have the consequence that punctiform objects are not reproduced in an ideally punctiform manner in the image. In the vicinity of the theoretical image point, the caustic is produced as the envelope of the rays actually intersecting in its vicinity. Spherical aberration is known, in which the axially parallel incident rays intersect in the image space respectively before or after the image point supplied by the paraxial rays. The axial image aberrations of higher "foldedness" lead to enlargements of the image point, which will be different depending on the azimuth. In the case of two-fold astigmatism, a circular object in the image plane is distorted into an elliptical image, since the meriodonal and sagittal rays perpendicular thereto have different focal lengths. For correction of these axial imaging aberrations extending up to a 3rd order, it is known to use correctives consisting of non-circular lens systems, as well as, for example from PCT/DE98/02596, a method for eliminating all axial image aberrations up to the 3rd order, in order to increase the resolution capacity.

The article in Japanese Journal Appl. Phys., Volume 38 (1999), pages 957ff, and GB 2 305 324 A disclose methods for determining 1st order image aberrations, in which the images from two different focussings are transformed in Fourier space and, by forming the quotient, are used for determining the image aberration coefficients. The method described here, however, is unsuitable for determining higher order image aberrations.

A disadvantage of this can be seen in the fact that the information obtained in the image point is determined both by the optical image aberrations of the imaging, probe-forming optical system and by the object structure itself. For determination of the image aberration, it would therefore be necessary to know the object structure, in order, from the image obtained, and the known object structure to be able to draw conclusions about the nature and size of the image aberration.

SUMMARY OF THE INVENTION

It is therefore an object of the present invention to provide a method, with which the geometrical-optical imaging aberration can be determined, without an exact knowledge of the object structure, which is imaged by the particle beam emitted by the source.

According to the invention, this object is achieved in that both quotients are reverse transformed and thereby the brightness profiles of the probes, that is to say of the images of the source in overfocus and underfocus, are determined. The asymmetry of the profiles with respect to the center, the width of the profiles, in particular the half-value width, and/or the curvature of the profiles in the center are determined, and the differences of the profiles of the probes with respect to these parameters are used to determine the image aberrations.

The basic finding of the invention is in the fact that, on transformation of the images of the object with a particle beam focussed on the object and an overfocussed and an underfocussed particle beam, and by subsequent division of the transforms in Fourier space, the object structure is cancelled out of the obtained quotients. The image corresponds mathematically to a folding of the object with a focussed or defocussed probe, that is to say in Fourier space to a product of object information and probe information. Consequently, after the Fourier transformation, the object information can be cancelled out by a division of the two transforms. That means that, by division in Fourier space, the information, contained in the transformations of the images, about the object to be imaged can be eliminated, so that the information about the optical image aberrations remains. In conventional terminology, the terms underfocussed and overfocussed mean that the particle beam is not focussed in the object plane, but before or after it with respect to the optical axis. If the defocus is large with respect to the probe diameter, with an image with a focussed particle beam, the focussed image is an approximately adequate reproduction of the object structure. The condition necessary for this, of an essentially punctiform source, is sufficiently satisfied by the above-described tungsten tip. In this case the defocussed probe, that is to say an image of the source with a defocussed particle beam, can be obtained from the reverse transformation of the quotient, which no longer contains information about the object structure. After this reverse transformation, the geometrical-optical image aberrations are determined, which lead to the distortion of the probe profiles. To this end, sections are formed through the probe profiles to determine the profiles of intensity, or brightness, of the images in the profile, that is to say perpendicular to the optical axis. The sections are, as discussed below, formed at equidistant angular intervals, in order also to determine the brightness and intensity distribution of the Image about the optical axis. To determine the geometrical-optical image aberrations, the asymmetry of the profiles with respect to the center are determined by subtracting the measurement values of the sections to the left and right of the center from one another, the width of the section, the half-value width and/or its curvature in the center usually being chosen here to simplify the evaluation. From these values, which are usually different, for the overfocussed and underfocussed probes, mean values and/or differences can also be formed. These angle-dependent values can be used to determine the image aberrations, and from the latter, by setting a corrective or by a mathematical image reconstruction methods, the correction can be made to obtain a sharp, undistorted image.

The advantage of the invention is in the fact that only one object needs to be imaged multiply in order, from the focussed, overfocussed and underfocussed images, to determine the geometrical-imaging aberration without the actual structure of the object needing to be known. From this, correction parameters can be determined, with which, with subsequent measurement series and different objects, the obtained measurement results, i.e. images, can be corrected to obtain a sharp image. To this end the optics of the system are analogously adjusted by appropriately setting a corrective, or mathematical correction methods are applied, to compensate for the aberrations.

For carrying out the Fourier transformation in the case of a particle beam focussed or defocused on the object, it is proposed that the transformation be carried out mathematically, in particular according to the fast-Fourier transformation known to one skilled in the art. In principle, it is also possible to carry out such a transformation in an analogous manner by producing a diffraction pattern. With the same method, reverse transformations of the respective quotients can also be carried out.

In particular in the case of scanning electron microscopes, the lenses for influencing the direction of the electron beam have electrical and/or magnetic multipoles, since these can focus and deflect the electron beam in a known manner. With these types of lenses, a correction of the geometrical-optical imaging aberration can also be provided in a simple manner, since a correction factor determined by the method described above, can be applied to the electrical and/or magnetic fields, that is to say they can be varied, to obtain an aberration-free image of the object.

To ensure that the information about the object structure is actually cancelled out by division in Fourier space, the width of the focussed probe, that is to say the image of the source in the defocussed state, must be at least ten times greater than the width of the focussed probe, or the actual width of the particle source.

Advantageously, the sections through the probe profiles are placed at equidistant angular intervals, in particular every 15 degrees, to obtain adequate resolution of the brightness or intensity profiles about the optical axis. To determine the geometrically optical imaging aberrations, the "foldednesses" of the sections are analyzed, that is to say how many planes of symmetry the probe profile has perpendicular to the optical axis.

The asymmetry of the sections serve for determining the second order image aberration. Since these ought to be theoretically the same in overfocus and underfocus, the mean value can be formed from the two measurements for further analysis. This mean value formed from overfocus and underfocus and depending on the section angle w, is subjected to analysis, with respect to the section angle of the one-fold and three-fold angle components, for example by a Fourier analysis, according to the section angle w. The one-fold component, regarding the orientation and magnitude, represents the value of the 2nd order axial coma. The three-fold component of the analysis supplies, regarding orientation and magnitude, the value of the three-fold 2nd order astigmatism.

The widths and curvatures of the probe profiles, which are dependent on the section angle w, can be used for the determination of further geometrical-optical image aberrations. In general terms, the width BR of the probe profiles provides a basis for determining the 1st order image aberration, and the determined values of curvature for determining the values of the 3rd order image aberration. For analysis, however, the following procedure is necessary: the common feature is that the differences between the measured values for overfocus and underfocus are determined in dependence on the section angle w. In the aberration-free case, the differences would disappear. Here, too, an analysis of the obtained difference values according to their foldedness with respect to the section angle w should be carried out, for example by the Fourier analysis. In this way, the spectrum components, ordered according to their foldedness, are obtained in dependence on the section angle w. The corresponding foldedness permits the assignment to the corresponding geometrical-optical image aberrations, the quantitative value, and, apart from the rotationally symmetrical image aberrations, its orientation provide information about the magnitude and, possibly, the alignment of a particular image aberration. In principle, the widths of the probe profiles and/or the differences in overfocus/underfocus allow the determination of the 1st order image aberrations, namely defocussing and 1st order two-fold astigmatism. The zero-fold component determined via the section angle of the difference of the width, that is to say the mean value formed via the section angle w, which is therefore direction independent, provides a dimension figure for the focussing and defocussing of the electron-optical system. The first order zero-fold image aberration represents the defocussing.

The two-fold component, determined by the same Fourier analysis, from the difference of the widths of the probe profiles, provides, according to magnitude and orientation, the value of the aberration of the 1 st order two-fold astigmatism.

From the curvatures of the probe profiles and the differences formed from overfocus and underfocus, the individual aberration components of the 3rd order image aberrations can also be obtained by an analysis of the foldedness via the section angle, carried out, for example, by means of Fourier analysis. Here, too, particular image aberrations are assigned in dependence on the foldedness, the size of the component giving the magnitude and orientation of the image aberration present. For example, the zero-fold component, that is to say the mean value of the section angle w, indicates a dimension figure for the 3rd order spherical aberration. The two-fold component, according to its magnitude and direction, gives the dimension figure for the 3rd order stellar aberration. Finally, the four-fold component, also according to its magnitude and direction, gives the value for the four-fold astigmatism. Thus all 3rd-order electron-optical image aberrations are determined.

Since in real optical systems the 1st and 3rd order image aberrations are never completely decoupled in width and curvature, a more accurate determination of 3rd order aberrations can be carried out using, instead of the curvature KR or width BR or their respective differences, linear combinations of the two values according to the aforementioned scheme. The respective associated multiplication factors α and β according to the formula:

$$\alpha^*BR+\beta^*KR$$

must be determined empirically for each particle-optical system to obtain the best possible results. For the 3rd order spherical aberrations, the mean value over the section angle w must be formed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION OF THE PREFERRED EMBODIMENTS

Figure 1:
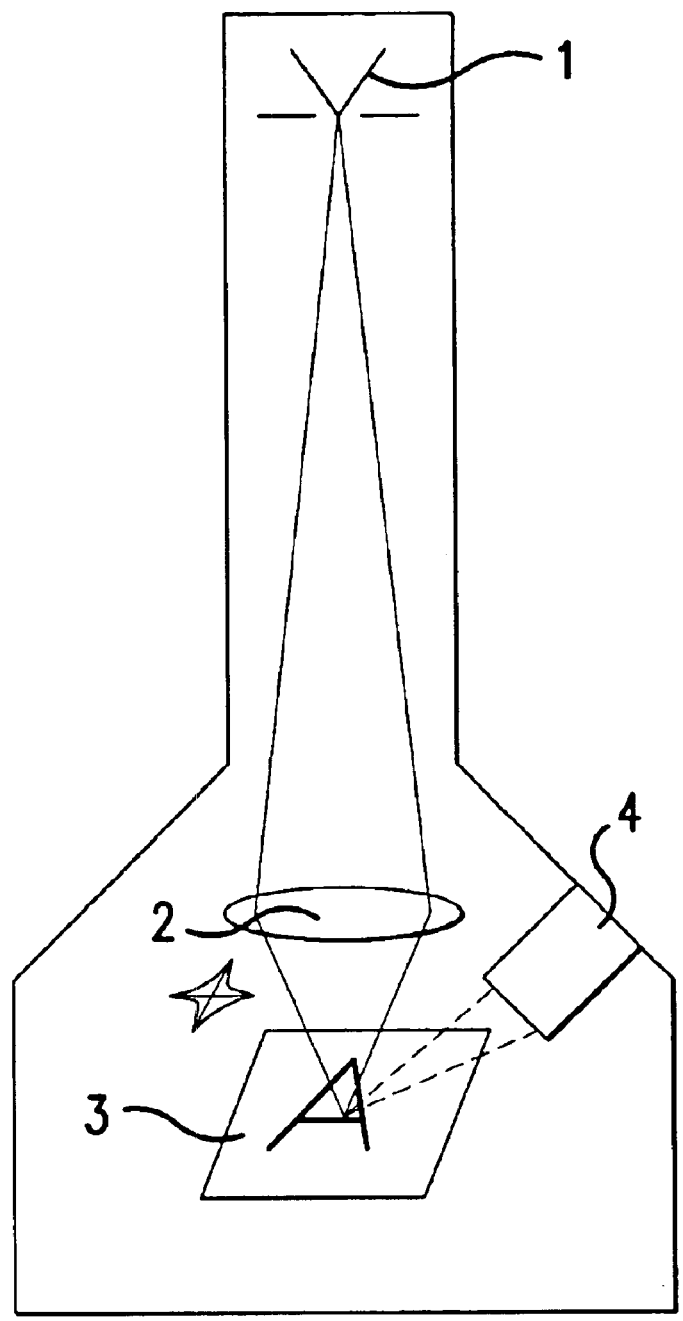
FIG. 1 shows a schematic view of a scanning electron microscope.

The exemplary embodiment of the invention shown in FIG. 1 is a scanning electron microscope, in which electrons are emitted from a source 1, usually an approximately punctiform tungsten tip, and are guided by lenses 2, such as electrical and/or magnetic multipoles, line by line over the object 3 to be imaged, as indicated by the arrows. The electrons radiated back by the object 3, or the secondary electrons emitted from it the object 3, are registered by a suitable detector 4, which registers an image in the form of a brightness or intensity distribution.

Figure 2:
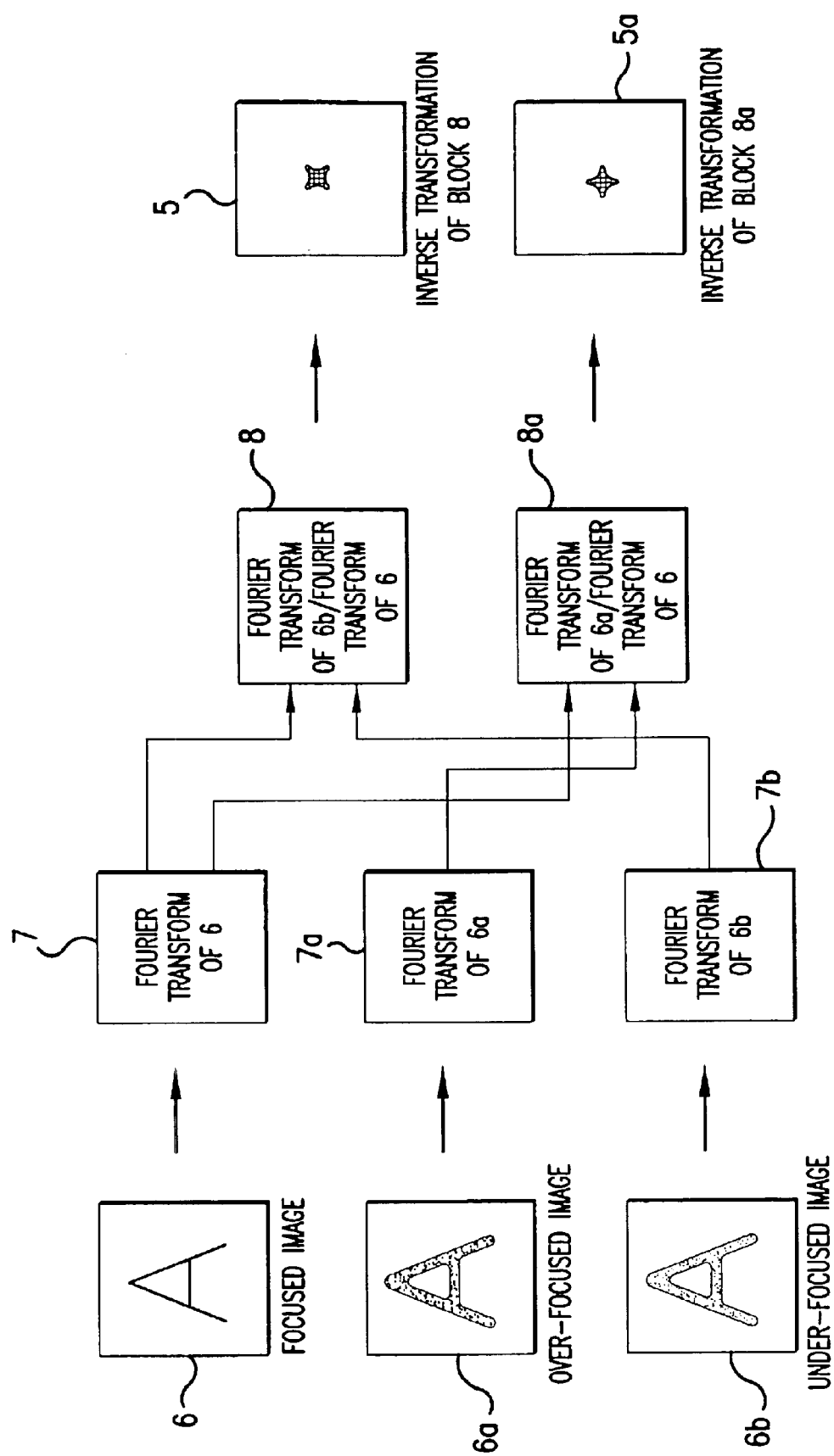
FIG. 2 shows a flow diagram for determining the probe form.

FIG. 2 shows the procedure by which the probe forms 5, 5a are obtained. To this end, the object 3 is imaged with a focussed, an overfocussed, and an underfocussed particle beam, and subsequently these images 6, 6a, 6b are subjected to a Fourier transformation. After division 8 of the transform 7a of the overfocussed image by the transform 7 of the focussed image, and the reverse transformation of the quotient, the information about the imaged object 3, which was still contained in the original images 6, 6a, 6b, is cancelled out, and, as a result, only the form of the probe in overfocus and underfocus 5, 5a is obtained. The same procedure is carried out for the transform 7b in underfocus.

Figure 3:
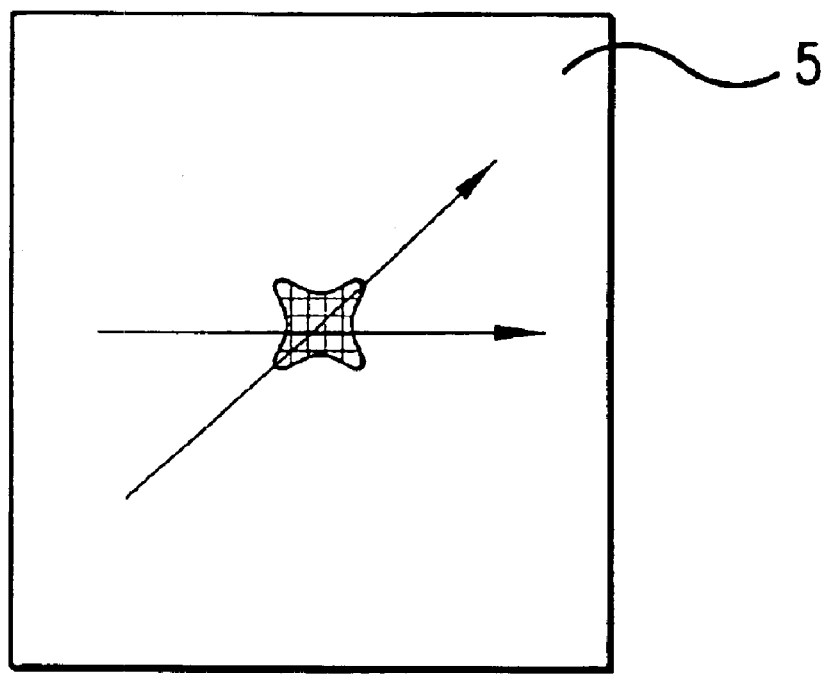
FIG. 3 shows an analysis of a probe profile.
Figure 4:
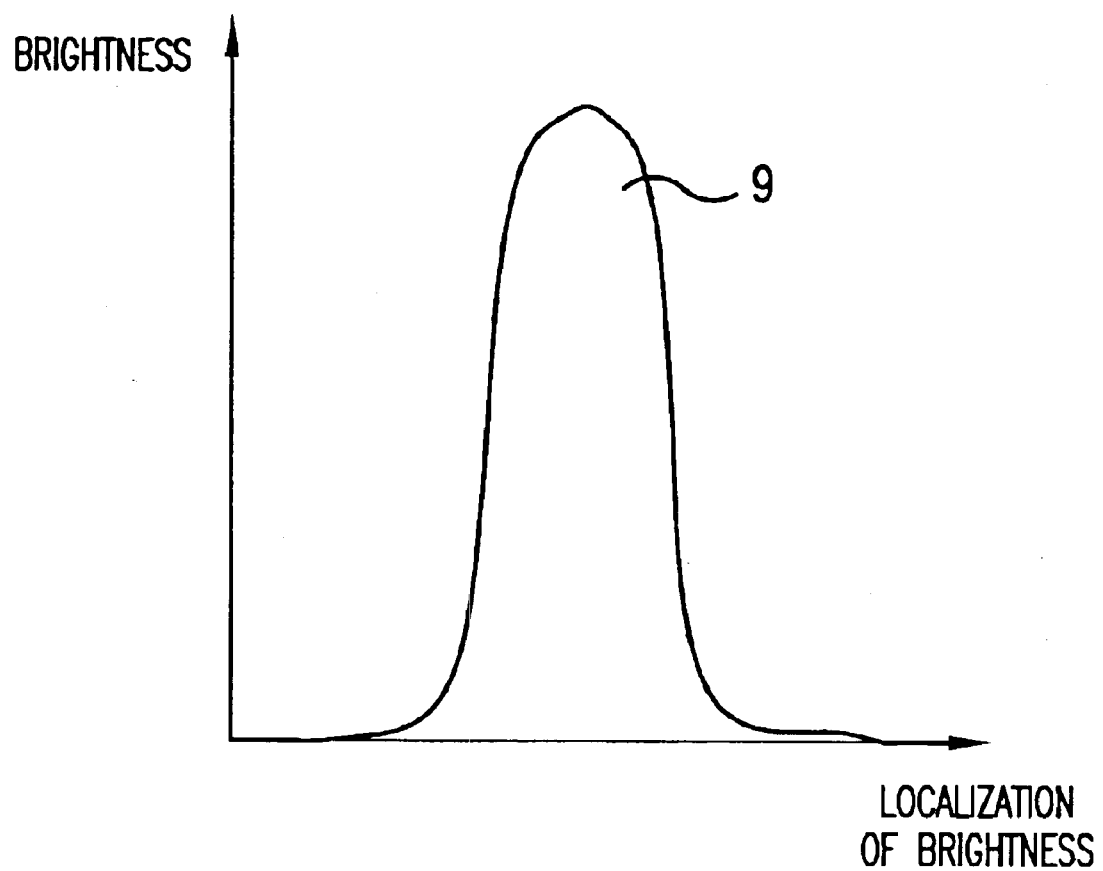
FIGS. 4 and 5 show sections through a probe profile.
Figure 5:
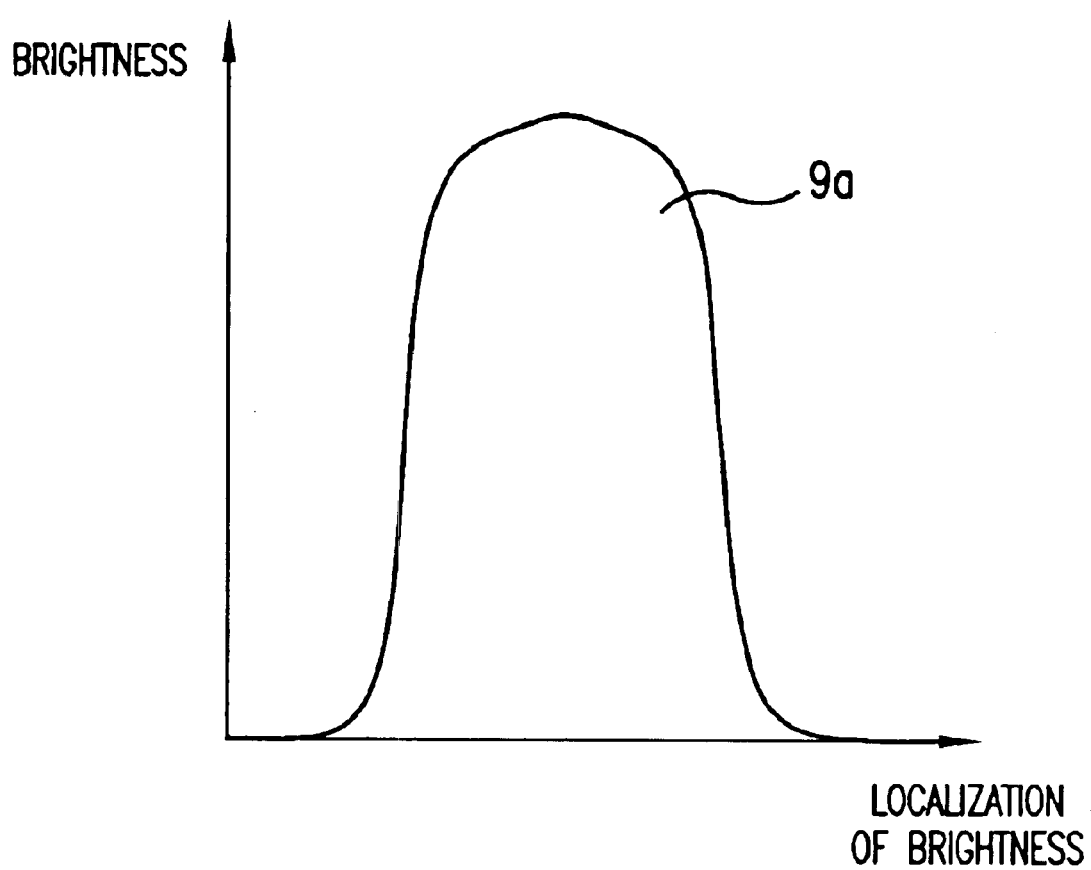

Subsequently, as shown in FIG. 3, sections are taken along various angles through the probe 5, and, the different forms of the sections 9, 9a, as shown in FIGS. 4 and 5, in particular their asymmetry, half-value width or curvature in the center, are used to determine the various geometrical-optical aberrations, as described above.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for determining geometrical-optical aberrations up to and including 3rd order in particle-optical, probe-forming systems, in particular scanning electron microscopes that include an essentially punctiform source, which emits a particle beam, lenses for influencing the particle beam, the particle beam having particles that image an object, and a detector for registering the particles or imaging the object, the method comprising:

imaging the object by the particle beam, which is focussed on the object;

recording the image;

repeating the imaging and recording steps utilizing an overfocussed and an underfocused beam, which produce overfocussed and underfocussed images;

transforming the overfocussed and underfocussed images in Fourier space;

dividing the transformation of the overfocussed image by a transformed focussed image thereby obtaining a first quotient; and dividing the transformation of the underfocussed image by the transformed focussed image, thereby obtaining a second quotient, wherein the first and second quotients are reverse transformed and thereby brightness profiles of the probes, are determined, the asymmetry of the profiles with respect to a center, a width of the profiles, in particular the half-value width, and/or the curvature of the profiles in the center are determined, and wherein differences of the profiles of the probes are used to determine the image aberrations.

2. The method according to claim 1, wherein the Fourier transformation and/or the reverse transformation is obtained by mathematical and/or optical means, preferably by generating a diffraction pattern.

3. The method according to claim 1, wherein the particle beam is influenced with electrical and/or magnetic multipoles.

4. The method according to claim 1, wherein the width of the defocused image of the source is at least ten times greater than the width of the focused image of the source or of the source itself.

5. The method according to claim 1, wherein sections are taken at angular intervals, in particular every 15 degrees, through the probe profiles in overfocus and underfocus, and the brightness profiles, the asymmetry, and the width of the probes are determined for each section.

6. The method according to claim 5, wherein, for determining a image aberration of 2nd order axial coma, the mean values of the asymmetries of the sections through the probes in overfocus and underfocus in dependence on section angles "w" are formed, and a magnitude and orientation of one-fold components of these mean values are determined, preferably by Fourier analysis with respect to the section angle "w".

7. The method according to claim 5, wherein, for determining a image aberration of three-fold 2nd order astigmatism, mean values of the asymmetries of the sections through the probes in overfocus and underfocus in dependence on section angle "w" are formed, and a magnitude and orientation of these mean values are determined, preferably by Fourier analysis over the section angle "w".

8. The method according to claim 5, wherein, for determining a defocussing, the difference between the widths of the sections through the probes in overfocus and underfocus in dependence on the section angle "w" is formed, and a magnitude of a zero-fold component of these differences are determined preferably by Fourier analysis over the section angle "w".

9. The method according to claim 5, wherein, for determining a two-fold 1st order astigmatism, the difference between the widths of the sections through the probes in overfocus and underfocus in dependence on the section angle "w" is formed, and a magnitude of a two-fold component of this difference is determined, preferably by Fourier analysis over the section angle "w".

10. The method according to claim 5, wherein, for determining a 3rd order spherical aberration, the difference between the curvature of the sections through the probes in overfocus and underfocus is formed in dependence on the section angle "w" and a magnitude of a zero-fold component of these differences is determined, preferably by Fourier analysis over the section angle "w".

11. The method according to claim 5, wherein, for determining a 3rd order stellar aberration, the difference between the curvature of the sections through the probes in overfocus and underfocus is formed in dependence on the section angle "w", and a magnitude of the two-fold component of the difference is determined, preferably by Fourier analysis over the section angle w".

12. The method according to claim 5, wherein, for determining a four-fold 3rd order astigmatism, the difference between the curvature of the sections through the probes in overfocus and underfocus in dependence on the section angles "w" is formed, and a magnitude of the two-fold component of these the difference is determined, preferably by Fourier analysis over the section angle "w".

13. The method according to claim 10, wherein, for determining a 3rd order spherical aberration, instead of the difference in curvature, the difference of a linear combination of curvature and width is used in the equation:

$$\alpha*BR+\beta*KR$$

wherein $\alpha$ and $\beta$ is determined empirically and represents a respective mean value with respect to the section angle "w".

* * * * *